United States Patent [19]
Bruce

[11] Patent Number: 4,540,938
[45] Date of Patent: Sep. 10, 1985

[54] DISPLAYING WAVEFORMS
[75] Inventor: Robert A. Bruce, Beaverton, Oreg.
[73] Assignee: Tektronix, Inc., Beaverton, Oreg.
[21] Appl. No.: 459,845
[22] Filed: Jan. 21, 1983
[51] Int. Cl.³ .............................................. G01R 13/20
[52] U.S. Cl. ................................. 324/121 R; 364/487
[58] Field of Search ................... 324/121 R, 102, 112; 364/487; 315/381, 383

[56] References Cited
U.S. PATENT DOCUMENTS 2,565,839 8/1951 Broadwell et al. ............. 324/121 R
4,471,348 9/1984 London et al. ................. 324/121 R

*Primary Examiner*—Ernest F. Karlsen
*Attorney, Agent, or Firm*—John Smith-Hill

[57] ABSTRACT

An apparatus for generating a video signal suitable to cause a representation of repetitive waveform to be displayed on a raster scan display device comprises a differential amplifier which forms an output signal representing a clipped version of the instantaneous difference between the voltage of the waveform and a voltage representing the position of the raster scan line then being executed. An absolute value circuit receives the output signal of the differential amplifier and generates an output signal representing the absolute value of the output signal of the differential amplifier with respect to a reference level. The absolute value signal is inverted and level shifted, and is amplified so that its excursions are of predetermined magnitude.

12 Claims, 11 Drawing Figures

WAVEFORM DISPLAY GENERATOR

DISPLAYING WAVEFORMS

This invention relates to the displaying of waveforms.

It is known to reconstruct a waveform from digitized samples, such as those obtained with an analog-to-digital converter. It is desirable to be able to display a visual representation of the reconstructed waveform in a realistic manner.

One of the most widely used displays is the cathode ray tube (CRT) display. There are two principal types of CRT displays, namely the oscilloscope-type display and the raster scan display. In the oscilloscope-type display, the light spot generated by the electron beam of the CRT sweeps repeatedly from left to right across the screen and always returns to the same point at the left of the screen. The light spot remains the same intensity during its left to right sweep, and is deflected in the vertical direction in dependence upon the instantaneous amplitude of the applied signal. In the raster scan display, the electron beam scans from left to right across the screen and scans vertically down the screen at a slower rate. Thus, the electron beam executes a predetermined scanning pattern over the area of the screen. The amplitude of the applied signal is used to modulate the intensity of the electron beam, and thus the brightness of the light spot generated by the electron beam impinging on the face plate of the CRT. Raster scan CRTs are generally more compact and of lower cost and less critical design than oscilloscope CRTs. Furthermore, the raster scan display is better suited to the other display functions of a digital instrument than is the conventional oscilloscope type of CRT.

Present techniques for displaying a representation of a waveform from digital samples on a raster-type display suffer from several serious disadvantages. If a realistic representation is to be obtained in the theoretically correct way, large amounts of computation must be performed to generate the display. Thus, the display cannot be updated quickly. A second problem with conventional techniques is the presence of objectionable artifacts known as display aliases or jaggies when the display is generated digitally.

The present invention may be used to solve both of these problems. In an embodiment of the invention, the display is generated directly from the waveform samples at the display refresh rate. Display artifacts are virtually eliminated giving a much more realistical display than conventional techniques.

For a better understanding of the invention, and to show how the same may be carried into effect, reference will now be made, by way of example, to the accompanying drawings in which.

Figure 1:
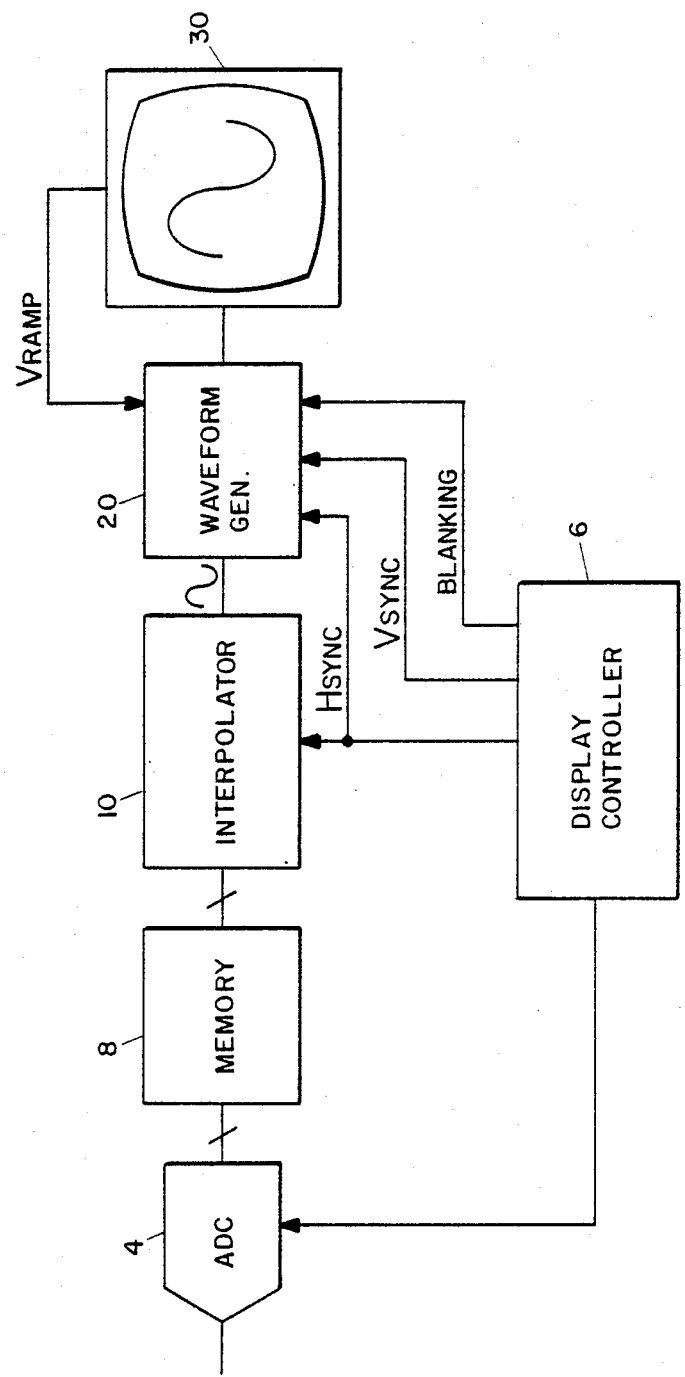
FIG. 1 is a block diagram of a display apparatus.

The display apparatus shown in FIG. 1 has an input terminal 2 to which an analog signal is applied. The input terminal is connected to an A/D converter 4 which operates under control of a display controller 6. The A/D converter 4 repeatedly samples the signal at the input terminal 2 within a predetermined interval, in which an event of interest is expected to occur, and generates digital data words representative of the amplitude of the analog waveform at the sampling times. The sampling must meet certain known criteria, e.g., the Nyquist criteria, as will be understood by those skilled in the art. The digital words generated by the A/D converter 4 are supplied to a display memory 8. Accordingly, the words stored in the memory 8 represent the variations in the value of the amplitude of the input signal during the predetermined interval. An interpolator 10 repeatedly accepts the digital words from the memory under control of the controller 6, and reconstructs therefrom an analog representation of the waveform of the analog signal within the predetermined interval. The reconstructed waveform, which repeats at a predetermined rate established by the controller 6, is identical to the originally sampled waveform except that it has been scaled in time. The repetitive analog waveform produced by the interpolator is applied to a waveform display generator 20 which generates a composite video output signal representative of the analog waveform. The composite video output signal is used to display the waveform on a raster scan CRT display 30.

The display controller generates not only the sampling control signals for the A/D converter 4 but also horizontal and vertical synchronizing signals and blanking signals. The synchronizing and blanking signals are utilized in the display generator 20 in generating the composite video output signal. In addition, the horizontal sync signal is used to control operation of the interpolator.

Figure 2:
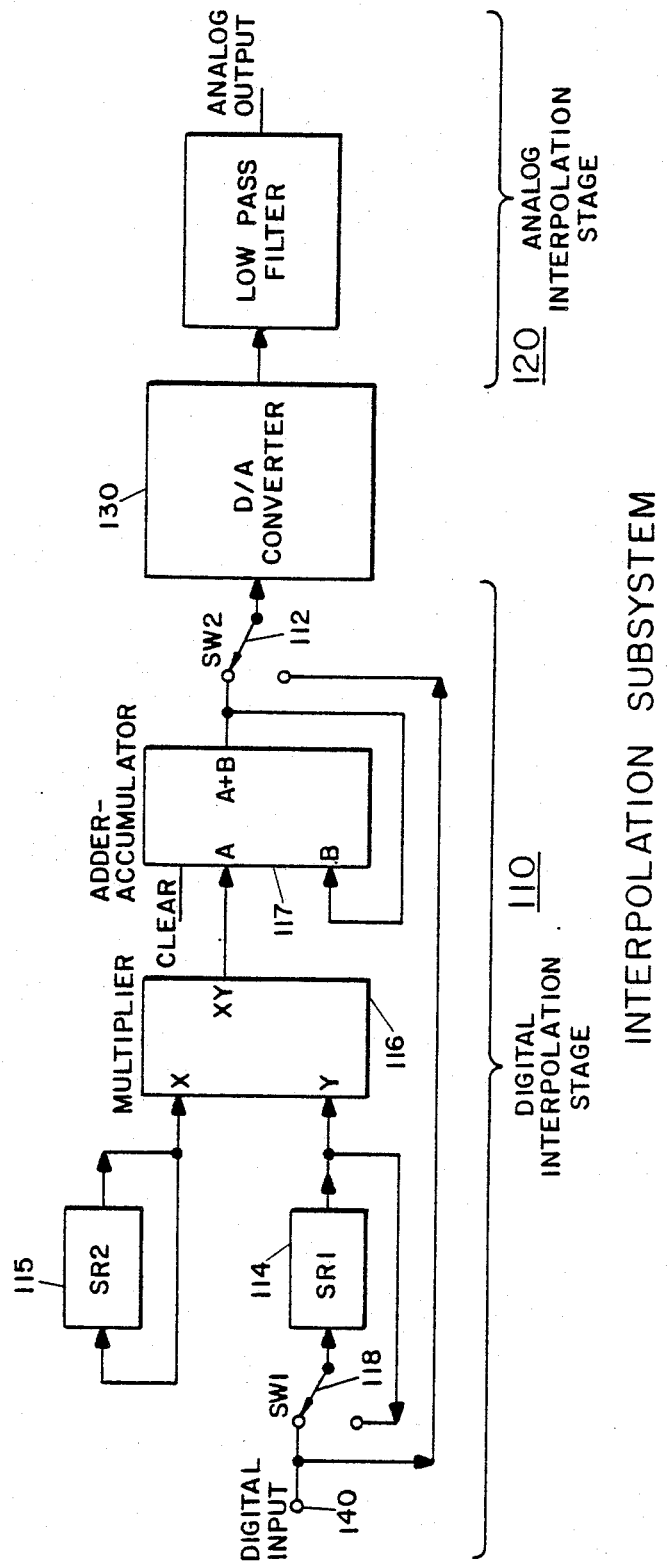
FIG. 2 is a block diagram of a first portion of the display apparatus.

The waveform interpolator 10 is of known type and is illustrated in block form in FIG. 2. The interpolator comprises cascaded digital and analog interpolation stages 110 and 120. The digital interpolation stage is a digital filter which produces from a series of input digital words defining points on a waveform, which words are applied to an input terminal 140, a second stream of digital words which define points exactly half-way between the points defined by the input words. The interpolated words are applied to one pole of a double pole switch 112 and the input words are also applied directly to another pole of the switch 112, which alternately selects the input data words and interpolated words, interleaving them into a single data stream.

Digital interpolation theory is well known. As shown in FIG. 2, the digital interpolation stage may comprise two shift register memories 114 and 115. The memory 115 contains a set of interpolation coefficients, which can be determined in known manner by those skilled in the art, while the memory 114 contains a sequence of input digital data words. The output of the shift register memory 115 is connected both to one input of a multiplier 116 and to its own input, so that the interpolation coefficients recirculate through the memory 115. The output of the shift register memory 114 is connected both to a second input of the multiplier 116 and to one pole of a double pole switch 118. The switch 118 is connected to the input of the memory 114, and its other pole is connected to the input terminal 140. The shift register memory 114 is initially loaded with a number of input digital words equal to the number of interpolation coefficients. The multiplier 116 forms the product of each input digital word with the associated interpolation coefficient, and the sum of these products is accumulated in an adder-accumulator 117. During this multiplication and accumulation operation the switch 118 allows the digital data word from the output of the memory 114 to be recirculated to the input, but as the product is formed of the last coefficient in the memory 115 and the oldest digital data word in the memory 114, the switch 118 is set to eliminate the oldest data word and allow a new input data word to enter the memory 114. The number accumulated in the adder-accumulator 117 is the desired interpolated word. It will be recognized by those skilled in the art that the operation of the digital interpolation state is to compute the convolution of the input data stream with the interpolation coefficients stored in the memory 115. The digital interpolation stage operates under control of the horizontal sync signal provided by the display controller 6, so that the entire sequence of input words is processed within one period of the horizontal sync signal.

The output of the digital interpolation stage is converted into analog form by a digital-to-analog converter 130, and this analog signal is applied to the analog interpolation stage. As is well known, the analog interpolation stage is an electrical low pass filter, which can be designed to achieve the desired performance characteristics. The output signal of the analog interpolation stage is the desired repetitive analog waveform, i.e., the waveform to be displayed. It will be appreciated that the repetition rate of the analog waveform is the same as that of the horizontal sync signal.

The combination of digital and analog interpolation stages performs a function difficult to achieve with either device separately. In order to reconstruct a continuous representation of the sampled waveform, an analog interpolator is required. However, analog interpolators do not have the required combination of sharp cutoff outside the pass band, flat in-band frequency response and linear phase characteristics, which are essential to a high performance interpolator. By performing a digital interpolation before the analog interpolation, the specifications for the analog interpolator can be relaxed considerably without comprising the performance of the system.

Figure 3:
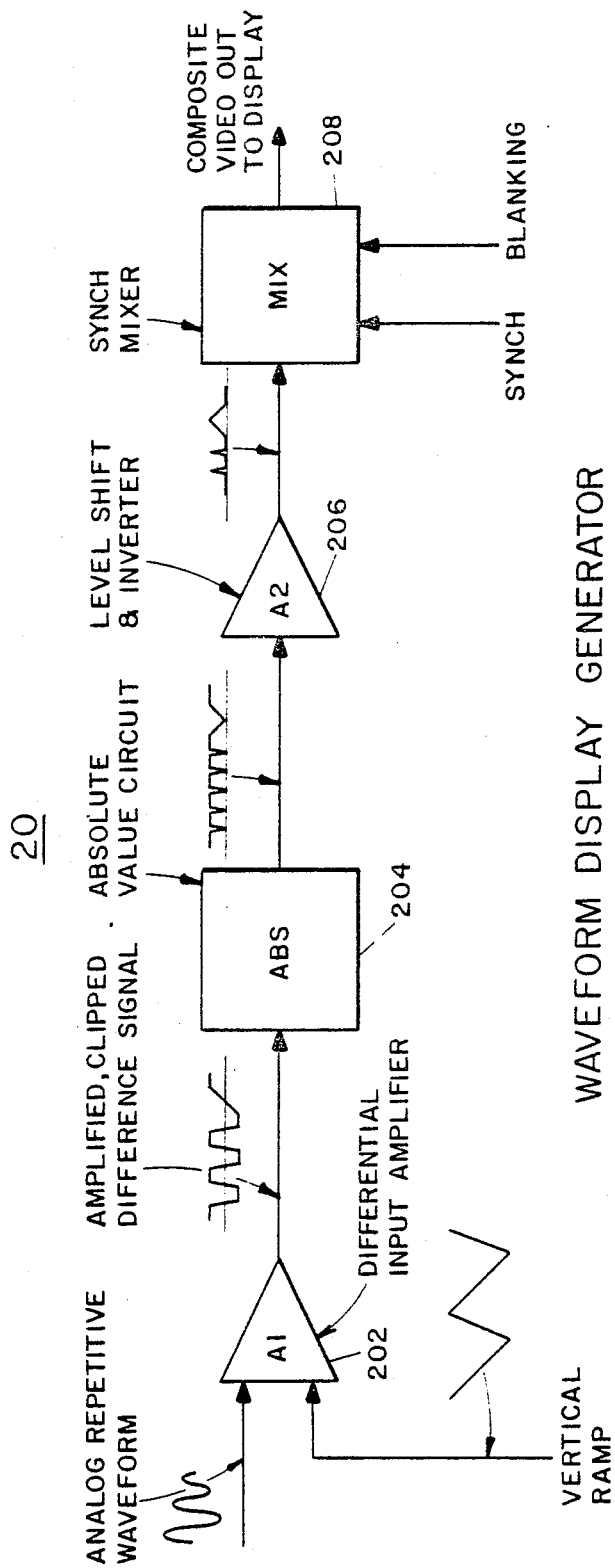
FIG. 3 is a block diagram of a second portion of the display apparatus.

The waveform display generator 20 is shown in FIG. 3, and comprises a differential input amplifier 202 which receives the repetitive analog waveform at one input and a ramp waveform at the other input. The analog waveform repeats at the horizontal scan rate. The ramp waveform is provided by the CRT display and repeats at the vertical scan frequency of the display, and is synchronized therewith. Thus, the voltage at the second input of the amplifier 202 is related to the vertical location of the scan line currently being generated on the CRT screen. The amplifier 202 generates an output signal which is an amplified and clipped representation of the instantaneous difference between the vertical position of the current horizontal scan line and the vertical position at which each elementary portion of the waveform should be displayed. This difference signal is applied to an absolute value circuit 204, which produces an output signal which is the absolute value of its input signal, i.e, the absolute value of the difference between the current scan line vertical position and the vertical position at which each elementary portion of the waveform should be displayed. This absolute value signal is applied to an amplifier 206, which inverts the absolute value signal (so that greater voltages of the absolute value signal correspond to smaller voltages of the inverted signal), shifts the level of the signal so that the minimum voltage appearing at the output of the amplifier 206, when further processed, is that required to produce a video output corresponding to black on the CRT display, and provides the appropriate amount of gain such that the maximum signal level appearing at the output of the amplifier 206, when further processed, is that which is required to produce white on the CRT display.

The gain of the differential amplifier 206 must be properly chosen to obtain the best possible display quality, and is an important factor in producing an extremely low level of display artifacts or jaggies. The gain should be given by:

$$\text{gain} = \frac{(V_{OUT}/2)}{(V_{RAMP}/N)} \quad (1)$$

Figure 4:
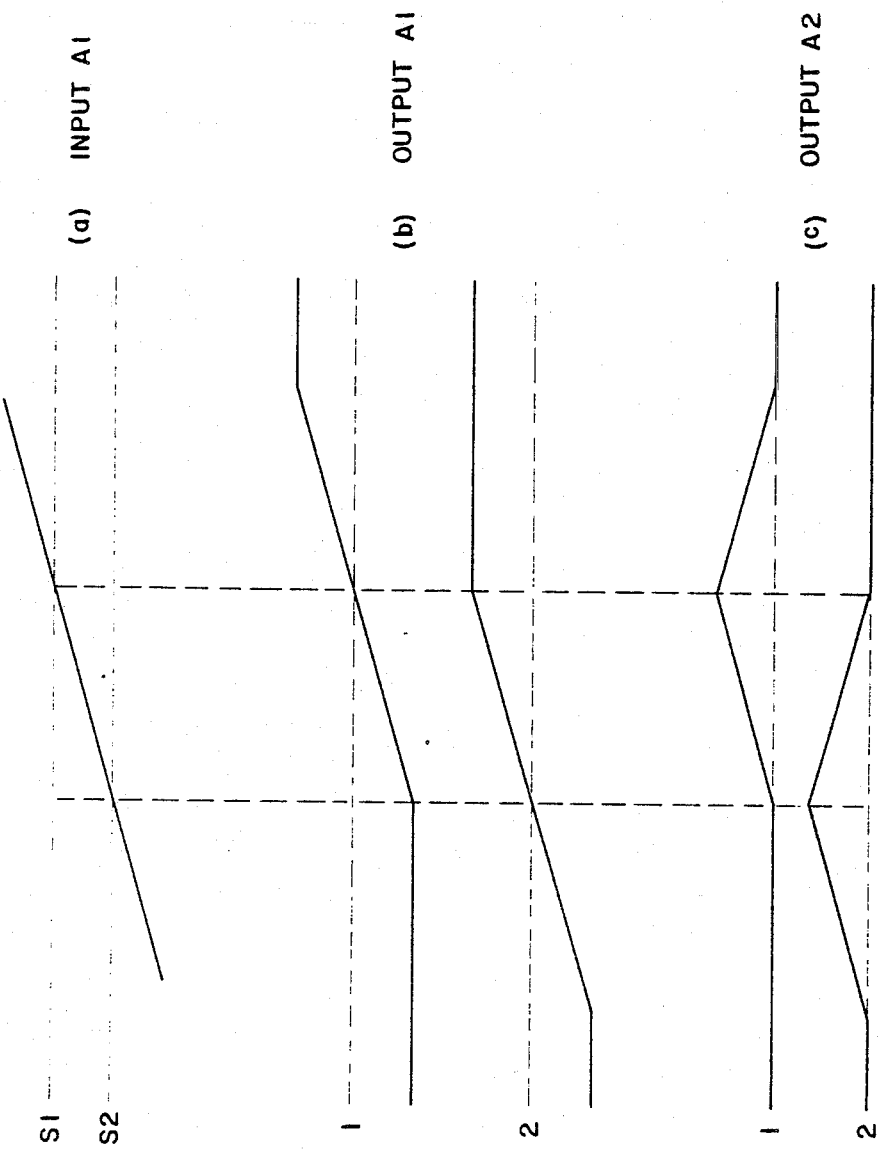
FIG. 4 shows graphs of voltage against time.

$V_{OUT}$ is the peak-to-peak output voltage of the amplifier 202 at its clipping level. $V_{RAMP}$ is the peak-to-peak voltage of the ramp waveform applied to the amplifier 202. N is the number of horizontal scan lines in the raster display (exclusive of the vertical blanking interval). The effect of the gain of the amplifier 202 on the video signal produced and the resulting display at most easily explained with reference to FIG. 4. FIG. 4a shows a gentle sloping line, representing a slowly changing portion of a waveform, crossing two successive horizontal scan lines S1 and S2. FIG. 4b shows the preferred output of the amplifier 202 on the two successive scan lines, indicated as 1 and as 2 in FIG. 4b. FIG. 4c shows the resulting video output signal from the amplifier 206 for these two scan lines. For optimum display quality, it is desirable that the video output on scan line S1 reach a maximum at just that horizontal position where the video signal of scan S2 has returned to zero. This condition is met when the gain of the amplifier 202 has the value indicated above. If the gain of the amplifier 202 is made lower than this value, the apparent width of the displayed waveform will increase, and if the gain of the amplifier 202 is made higher, the displayed waveform will not be smooth and continuous.

FIG. 3 is intended to demonstrate the functions performed by the waveform display generator in an easily understood way. Variations in the order and manner in which the functions are performed are possible. For example, in a specific implementation of the waveform display generator, shown in FIG. 5, the differential amplifier 202' provides a differential output, which simplifies the implementation of the absolute value circuit 204'. The negative of the absolute value is produced by the absolute value circuit 204', and therefore it is not necessary that the amplifier 206' perform an inverting function.

Figure 5:
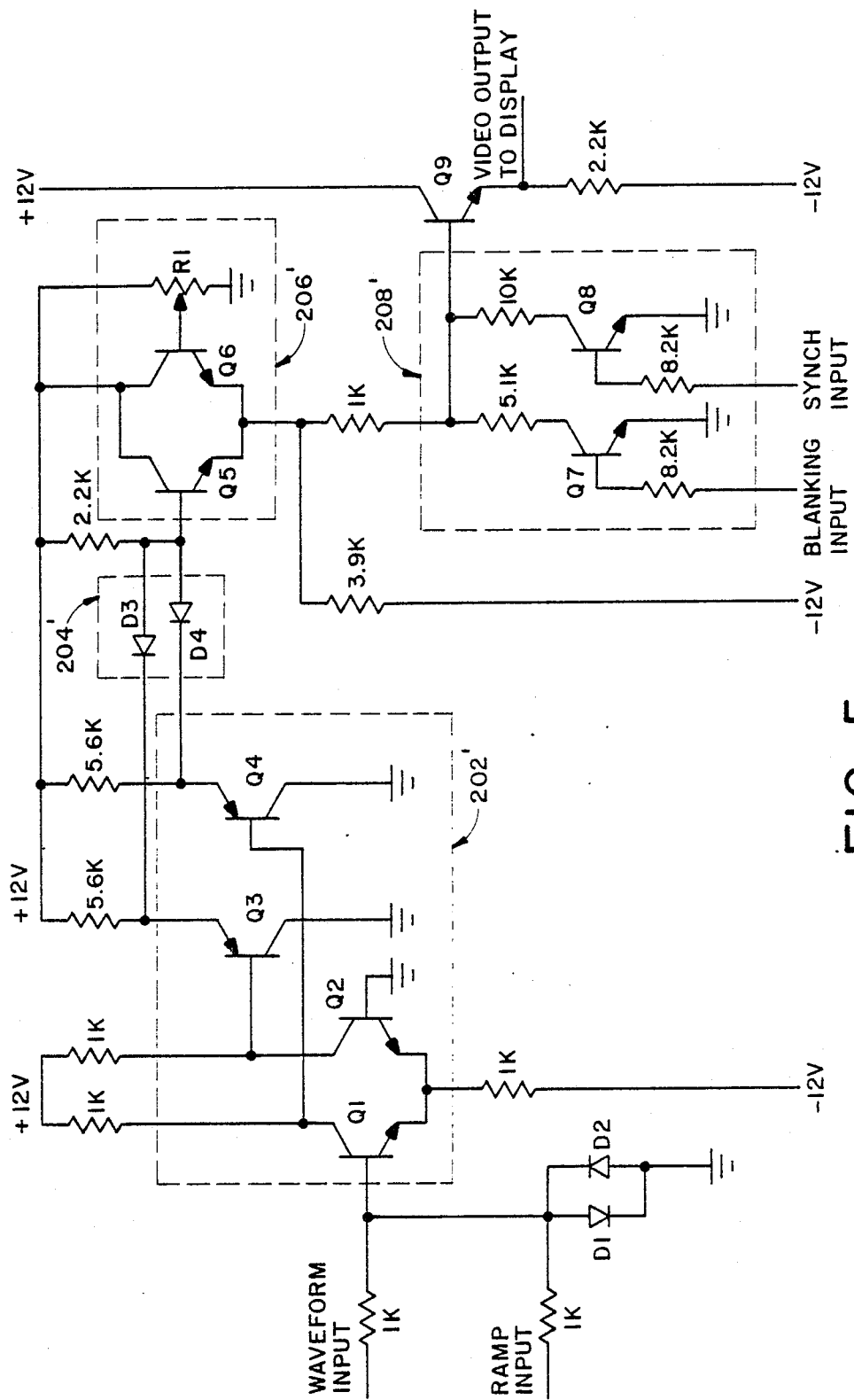
FIG. 5 is a schematic diagram of a practical implementation of the second portion of the display apparatus.

In the specific implementation shown in FIG. 5, the differential amplifier 202' is formed by transistors Q1, Q2, Q3 and Q4. The transistors Q1 and Q2 are connected in common emitter configuration, and the bases of the transistors Q3 and Q4 are connected to the collectors of the transistors Q1 and Q2 respectively. The analog waveform and the vertical deflection ramp signal are both applied to the base of the transistor Q1. The diodes D1 and D2 which are connected between the base of the transistor Q1 and ground limit signal excursions at the input of the amplifier, as is well known to those skilled in the art. A differential output signal is developed between the emitters of the transistors Q3 and Q4, which are connected to diodes D3 and D4 respectively, together forming the absolute value circuit 204'. The anodes of the diodes D3 and D4 are connected to the base of a transistor Q5, forming the input of the amplifier 206'. The transistor Q5 and the associated transistor Q6 perform the clipping function which was associated with the amplifier 202 of FIG. 3. The clipping level is adjusted by means of a potentiometer R1, which controls the base voltage of the transistor Q6. The potentiometer R1 also provides some control over the display characteristics discussed in connection with FIG. 4. The particular point in the circuit at which clipping takes place depends upon the specific implementation. Transistors Q7 and Q8 perform the sync and blanking mixing functions, and the resulting composite video signal is buffered by the transistor Q9.

The waveform display generator circuit described with reference to FIGS. 3 and 5 has the disadvantage that waveforms displayed on a raster-scan display using this circuit show considerable variation in brightness and trace width. More nearly vertical portions of the waveform appear much dimmer and possess a much narrower trace width than the more nearly horizontal portions of the displayed waveform. The modifications shown in FIGS. 6 and 9 eliminate this problem.

Figure 6:
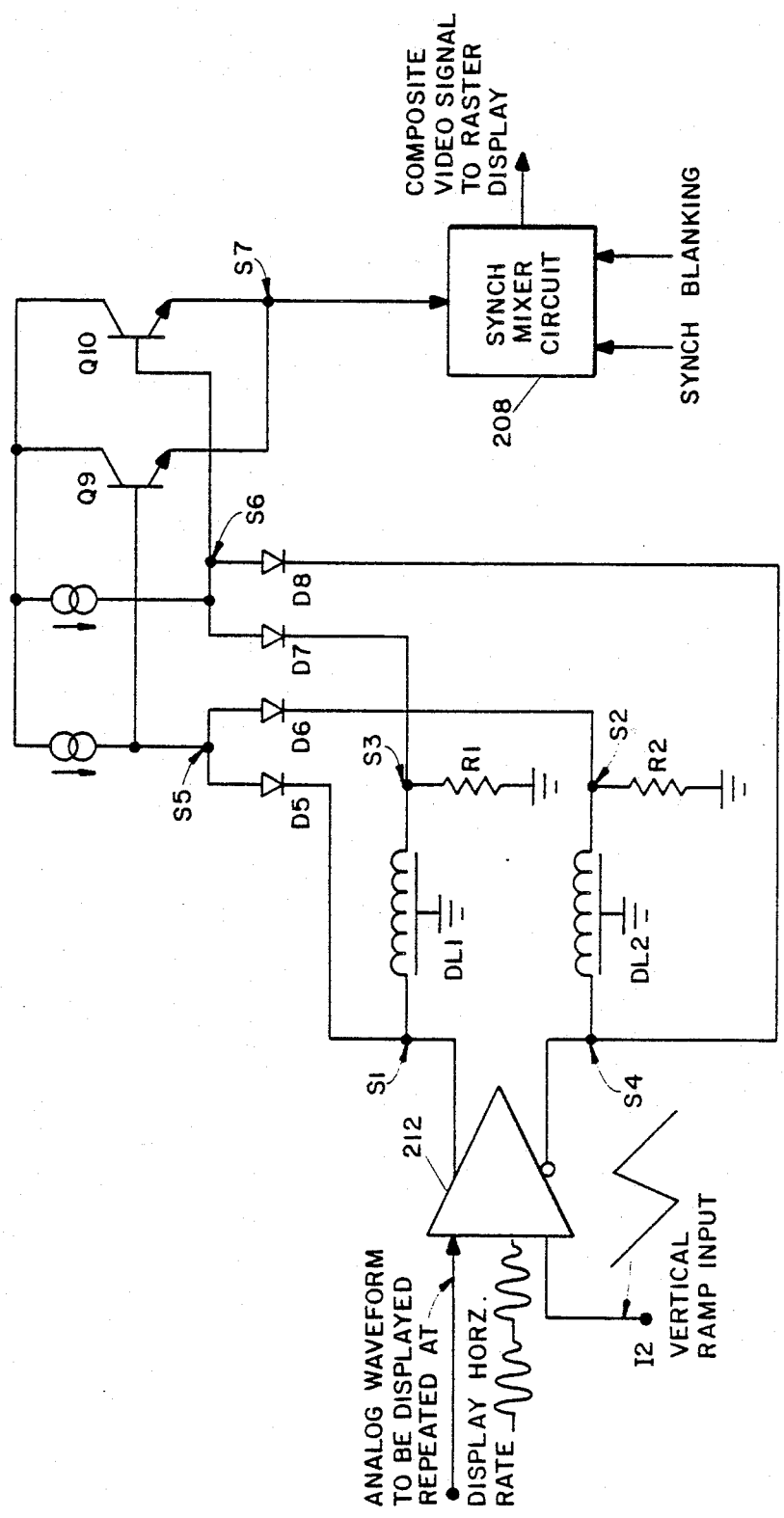
FIGS. 6 and 9 show, partly in block form and partly in schematic form, respective modifications of the waveform display generator shown in FIG. 3.

FIG. 6 shows the essential circuitry for an improved implementation of the display generator. To avoid confusion, the operation of the improved circuit is described below in its entirety, although many aspects of it are identical to the implementation described with reference to FIGS. 3 and 5.

The display generator accepts two signals as inputs. The first signal, entering the circuit at I1, is an analog replica of the waveform to be displayed. This signal is to be displayed as a waveform with the vertical dimension representing voltage and the horizontal dimension representing time. The signal at I1 repeats at the horizontal scan rate of the raster display system. The required signal could be generated, for example, by a digital memory, digital-to-analog converter and filter system such as described with reference to FIG. 2. Other implementations of a suitable digital memory, digital-to-analog converter and filter system are possible, and are understood by those skilled in the art.

The second input signal to the display generator is a voltage ramp signal which repeats at, and is synchronized with, the vertical scan rate of the raster scan display system. It is applied to the display generator at point I2. The voltage at point I2 is thus related to the vertical position of the scan line currently being traced out on the raster display.

The two input signals at I1 and I2 enter a limiting differential amplifier 212. The amplifier has two outputs: a noninverted output at point S1, and an inverted output at point S4. The outputs of the amplifier 212 represent the amplified and clipped difference between the voltage at input I1 and input I2. For small differences, the outputs S1 and S4 are thus proportional to the instantaneous vertical distance between the current display scan line and the vertical position at which the waveform should be displayed.

The signals at S1 and S4 are applied to delay lines DL1 and DL2, respectively. Resistors R1 and R2 terminate the delay lines in their characteristic impedances to minimize reflections as is understood by those skilled in the art. Thus the signal at point S3 is a delayed copy of the signal S1 and the signal at point S2 is a delayed copy of the signal at S4.

The signals at point S1 and S2 are combined by diodes D5 and D6 to form a signal at point S5. Similarly, the signals at S3 and S4 are combined by diodes D7 and D8 to produce a signal at point S6. The operation of the diodes D5 and D6 is such that the voltage at point S5 follows the voltage at either point S1 or S2, whichever is lower. Thus, ignoring for a moment the function of the delay line, the signal at S5 is a full-wave rectified version of the output of the amplifier 212. Similarly, the voltage at point S6 follows the lower of the voltages at S3 and S4.

The signals at S5 and S6 are combined at the emitters of transistors Q9 and Q10 to form the signal at S7. The function of the transistors is such that the voltage at S7 follows the voltage at point S5 or S6, whichever is greater.

The signal at S7 is the video signal which when applied to a raster-scan display system will produce the desired display of the waveform applied at input I1. Thus variations in the voltage at S7 correspond to desired changes in intensity on the display screen as the raster is traced out. Before S7 is applied to the raster display system, it passes through a synch mixer circuit 208 which adds synch and blanking information to the video signal. Synch mixer circuits are well known to those skilled in the art. The video signal which leaves the synch mixer 208 can be applied to the input of a raster-scan display system such as a standard closed-circuit television monitor. Raster-scan display systems are well understood by those skilled in the art.

The manner in which the circuit shown in FIG. 6 produces the video signal required to provide a display of the waveform applied to its input I1 will now be described.

As previously noted, the outputs of amplifier 212 are voltages proportional to the vertical distance between the scan line currently being traced out on the display, and the desired vertical position of the displayed waveform at any given point in time. Two special cases will be considered separately: first the case where a portion of the displayed waveform is changing slowly, yielding a relatively more horizontal trace on the display, will be examined; and secondly a portion of the waveform where the voltage is changing rapidly, producing a more nearly vertical trace on the display, will be examined.

Figure 7:
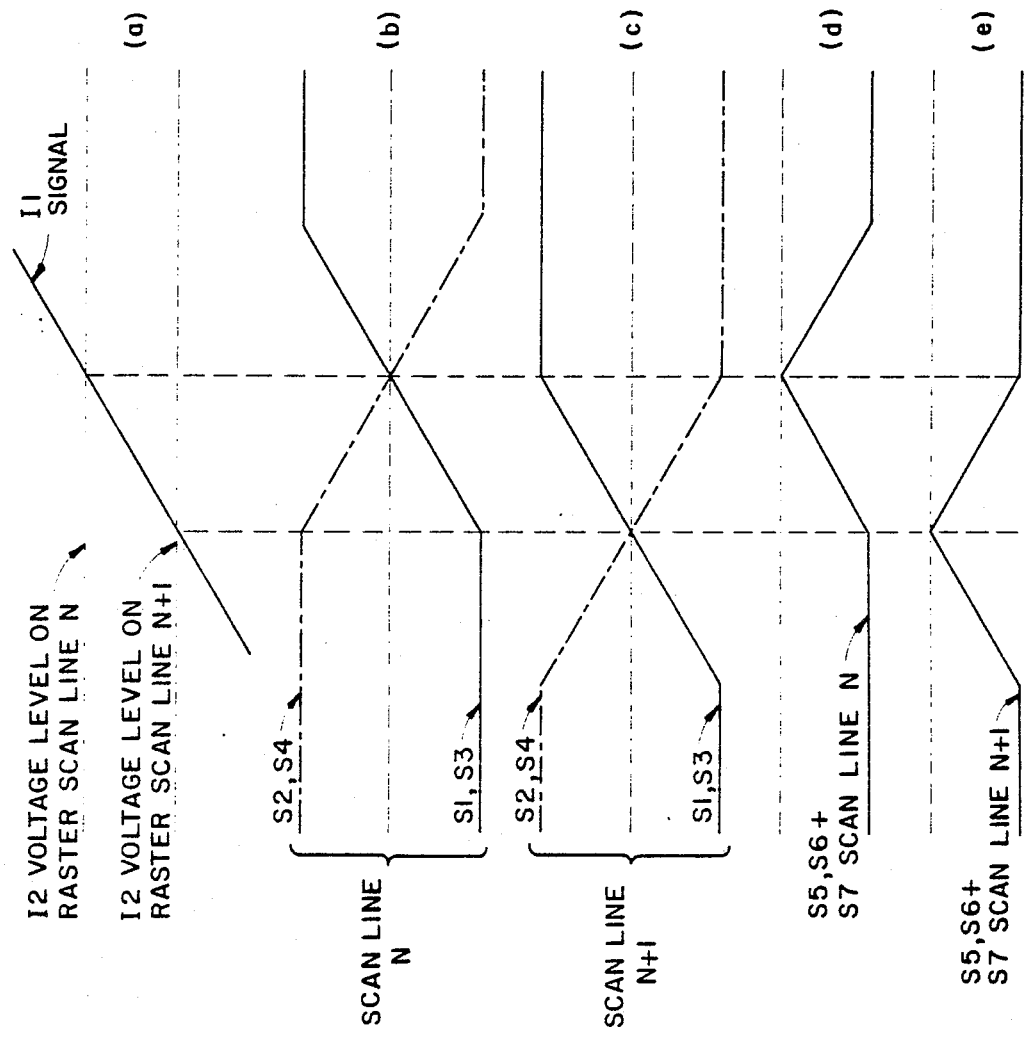
FIGS. 7 and 8 show graphs of voltage against time, representing the response of the FIG. 6 generator to different types of waveform input.

FIG. 7 shows some signals which appear at several points in the circuit when a gradually changing input signal is to be displayed. FIG. 7a shows the gradually changing input signal applied to input I1 of the circuit. This signal is shown as a solid line. Also shown are the voltage levels of the vertical ramp signal applied to input I2 on two successive scan lines. These voltage levels are shown by the nearly horizontal dashed lines. FIGS. 7b and 7c show the outputs of the amplifier 212 on S1, S2, S3 and S4 at two successive scan lines. For gradually changing waveforms, the effect of the delay lines can be ignored since the delays are quite short compared to the time intervals being considered here. Note that when the voltages at I1 and I2 are approximately equal, the outputs of 212 are proportional to the vertical distance between the scan line currently being traced out on the display and the waveform to be displayed. For larger differences, however, 212 clips and the outputs do not vary with changes at the inputs. FIGS. 7d and 7e show the signals which appear at points S5, S6 and S7. For simplicity, the constant voltage shifts produced by the diodes D5-D8 are not shown. The signal appearing at S7, as shown in FIGS. 7d and 7e reaches a peak at the point in time where I1 equals I2, corresponding to a point on the display where the displayed waveform crosses a scan line. It will be noted that the signal drops off on either side of its peak as the distance from displayed waveform to scan line increases. In particular, the signal at S7 reaches its minimum when the displayed waveform is one or more scan lines above or below the scan line currently being displayed. When the signal at S7 is applied to the raster display system, via the synch mixer 208, it causes the intensity of the display along a scan line to go from a minimum gradually to a maximum, and gradually back to a minimum. This shading of intensity is just that required to display the waveform applied at I1 on the raster display without objectionable staircase effects or "jaggies". To obtain the preferred video signal at point S7, the gain of amplifier 212 just be selected to provide the waveforms shown in FIG. 7. In particular, the preferred gain of amplifier 212 is the same as that of the amplifier 202 (FIG. 3) and given by equation (1) above.

If the gain of amplifier 212 is made much greater than the preferred value, the nearly horizontal portions of the displayed waveform will not appear smooth and continuous, but will have a "beaded" appearance. If, however, amplifier 212 has a gain significantly lower than the preferred value, the nearly horizontal portions of the displayed waveform will appear too wide for a sharp display.

Figure 8:
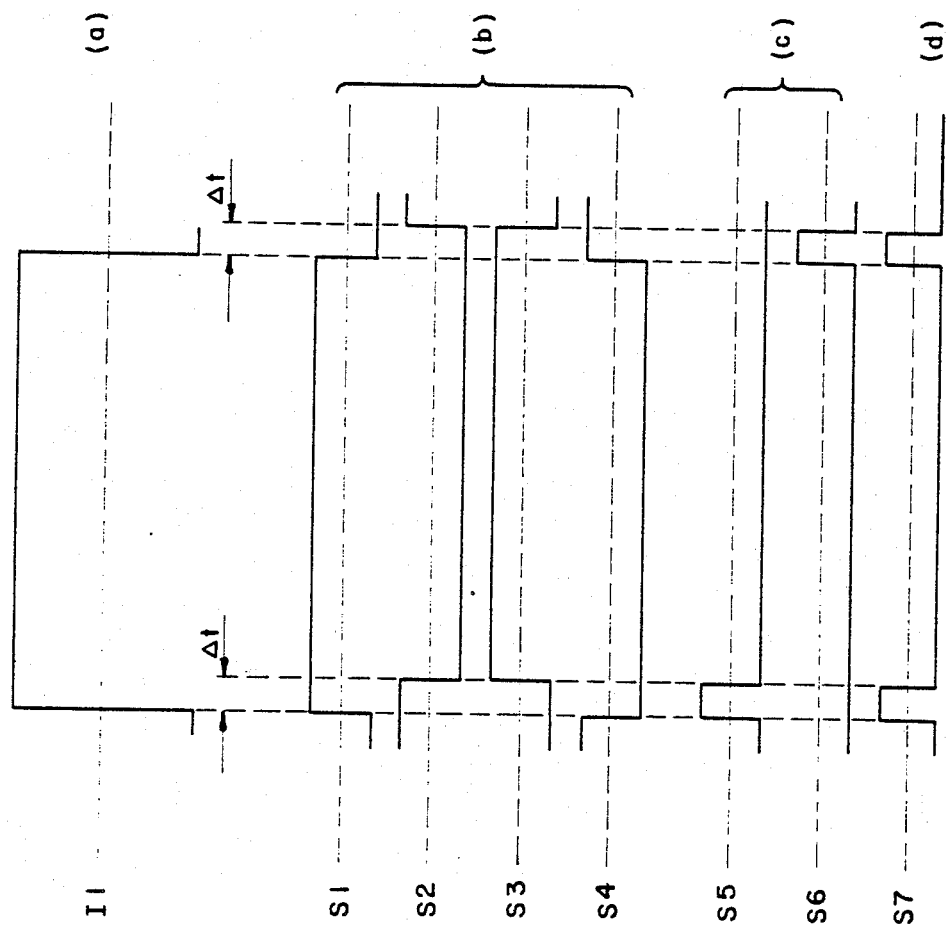

The manner in which the correct video signal is generated for displaying nearly vertical portions of a waveform will now be described. Typical waveforms at several points in the circuit shown in FIG. 6 are shown in FIG. 8. The solid line in FIG. 8a shows an input signal at I1 which contains two nearly vertical transitions; one positive-going and one negative-going. The dashed line in FIG. 8a represents the voltage level at input I2 on a certain display scan line. FIG. 8b shows the outputs of 212 at points S1, S2, S3 and S4. Note that S3 is a delayed copy of S1 and S2 is a delayed copy of S4. The delay, provided by the delay lines DL1 and DL2, is indicated by Δt in the figures. FIG. 8c shows the signals at points S5 and S6. Note that S5 has a pulse of width Δt on the rising edge of the input signal at I1, while S6 has a pulse on the trailing edge. FIG. 8d shows the signal at point S7 where the signals at S5 and S6 have been combined to produce the desired video signal for the display system. On the display, this scan line will be intensified at points corresponding to the leading and trailing edges of the displayed waveform. It can be seen from the figures that the width of the intensified leading and trailing edges of the displayed waveform will depend on the delays provided by DL1 and DL2. In the preferred implementation, the delays chosen will be the minimum which still produce a bright display of the rising and falling edges of displayed waveforms. This delay will depend on video display system bandwidth as is understood by those skilled in the art. In a display generator system that has been properly designed in accordance with the teachings contained herein, displayed waveforms will appear sharp and have uniform intensity for horizontal and vertical areas, as well as areas of intermediate slopes. In addition, display artifacts such as "staircasing" and "jaggies" will be minimized.

Figure 9:
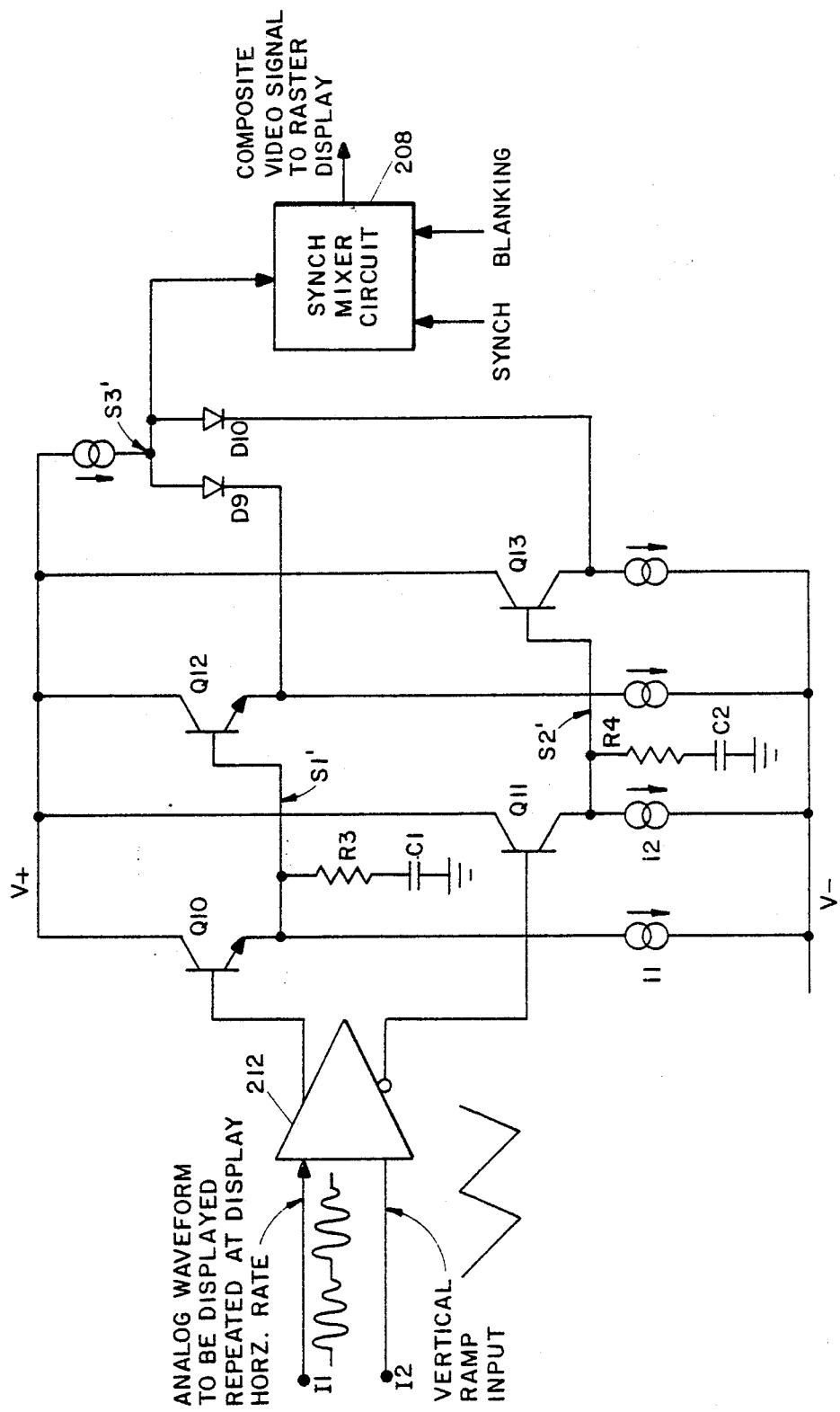

FIG. 9 shows another variation of the display generator circuit which allows a minimum displayed trace width to be defined for nearly vertical portions of a displayed waveform. This circuit uses no delay lines and thus is suited for integration on a monolithic integrated circuit. The display generator has two inputs, I1 and I2. As in the case of FIG. 6, these inputs go to the inputs of a differential amplifier 212, with well-defined output clipping or limiting characteristics. The design details of such an amplifier are understood by those skilled in the art. The amplifier 212 has two outputs, one providing a non-inverted output signal, while the other provides an inverted output. The noninverted and inverted output signals are applied to transistors Q10 and Q11, respectively. These transistors are operated as emitter follower circuits. The capacitors C1 and C2 at the outputs of the emitter followers limit the slew rate at points S1' and S2', respectively. Since the emitter followers can charge the capacitance of C1 and C2 much faster than the emitter load current sources i1 and i2 can discharge the capacitors, the risetime at S1' and S2' is shorter than the falltime for step inputs to 212'. The resistors R3 and R4 are chosen to reduce any instability in emitter followers Q10 and Q11 which could be caused by capacitors C1 and C2. They typically have small values. The signal at S1' is applied to emitter follower Q12, while the signal at S2' is applied to emitter follower Q13. The signals at the emitters of Q12 and Q13 are combined by diodes D9 and D10 to form a signal at point S3'. The voltage at S3' tracks the voltage at S1' or S2', whichever is lower. Thus the signal at S3' approximates a full-wave rectified version of the output of 212. The signal at S3' is applied to a synch mixer circuit 208 which adds in synch and blanking signals to operate a standard raster type closed circuit television monitor. Synch mixer circuits are well understood by those skilled in the art. The output of the synch mixer is a video signal which, when applied to a suitable raster-type television monitor will allow the monitor to display a replica of the repetitive waveform applied to input I1.

The manner in which the circuit shown in FIG. 9 produces the video signal required to display a replica of the waveform applied at input I1 will now be described. The display generator produces the video signal for the more nearly horizontal portions of the displayed waveform in a different manner than the more nearly vertical portions of the displayed waveform. These modes of operation will be described separately below.

Figure 10:
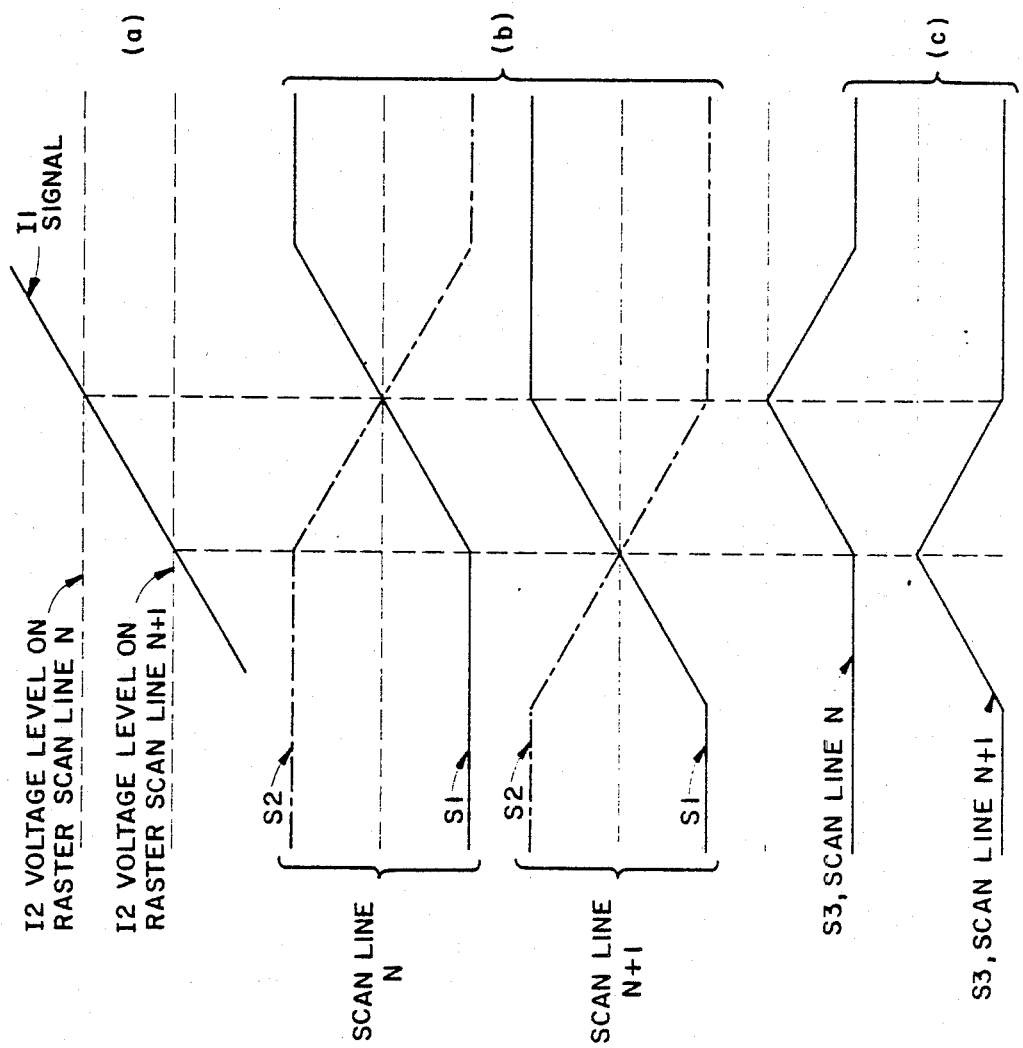
FIGS. 10 and 11 show graphs of voltage against time, representing the response of the FIG. 9 generator to different types of waveform input.

As previously noted, for small differences in the voltages at inputs I1 and I2 of 212, the differential output voltage of 212 is proportional to the vertical distance between the display scan line currently being traced out on the display and the desired vertical positioned of the displayed waveform at any given point in time. For the case of a nearly horizontal portion of the displayed waveform, voltages as a function of time are plotted in FIG. 10 for several points in the circuit. FIG. 10a shows the input signal (solid line) at I1 as a slowly rising voltage level. The dashed lines in FIG. 10a show the voltage at input I2 for two particular neighboring display scan lines. FIG. 10b shows the outputs of amplifier 212 at points S1' and S2' for the same input signals. It can be seen that when the I1 waveform "crosses" and is thus equal to the I2 voltage level, the voltage levels at S1' and S2' are equal. As the voltage at I1 gradually becomes more positive or negative than the voltage at I2, the voltages at S1' and S2' become unequal, and soon reach the clipping levels. FIG. 10c shows the signal at S3' where the signals at S1' and S2' have been combined. Note that the voltage at S3' reaches a maximum when the voltage at I1 equals the voltage at I2, and decreases linearly as a function of the absolute value of the voltage difference between point I1 and point I2. Thus the voltage at point S3' is at a maximum when the waveform at point I1 crosses the scan line currently being displayed. The gain and clipping characteristics of 212 have been chosen so that the voltage at point S3 decreases linearly with the vertical distance between the waveform to be displayed and the current scan line, reaching a minimum when the distance is greater than the vertical spacing between two adjacent scan lines. Thus the displayed scan line will show a linear increase in intensity to a maximum, then dropping in intensity again to its minimum. This scan line intensity profile is just that required to display the nearly horizontal portion of the waveform with a minimum of display artifacts such as "staircases" and "jaggies". The use of shading or intensity variations to minimize artifacts in the raster display of lines is well known to those skilled in the art. The preferred gain for amplifier 212 is the same as that for the amplifier 212 of FIG. 6 and given by equation (1) above. If the gain of 212 is made significantly greater then the preferred value, the nearly horizontal portions of the displayed waveform will have a "beaded" appearance and will not appear smooth. On the other hand, if the gain of 212 is made too low, the nearly horizontal portions of the waveform will appear to be too thick and unsharp.

Figure 11:
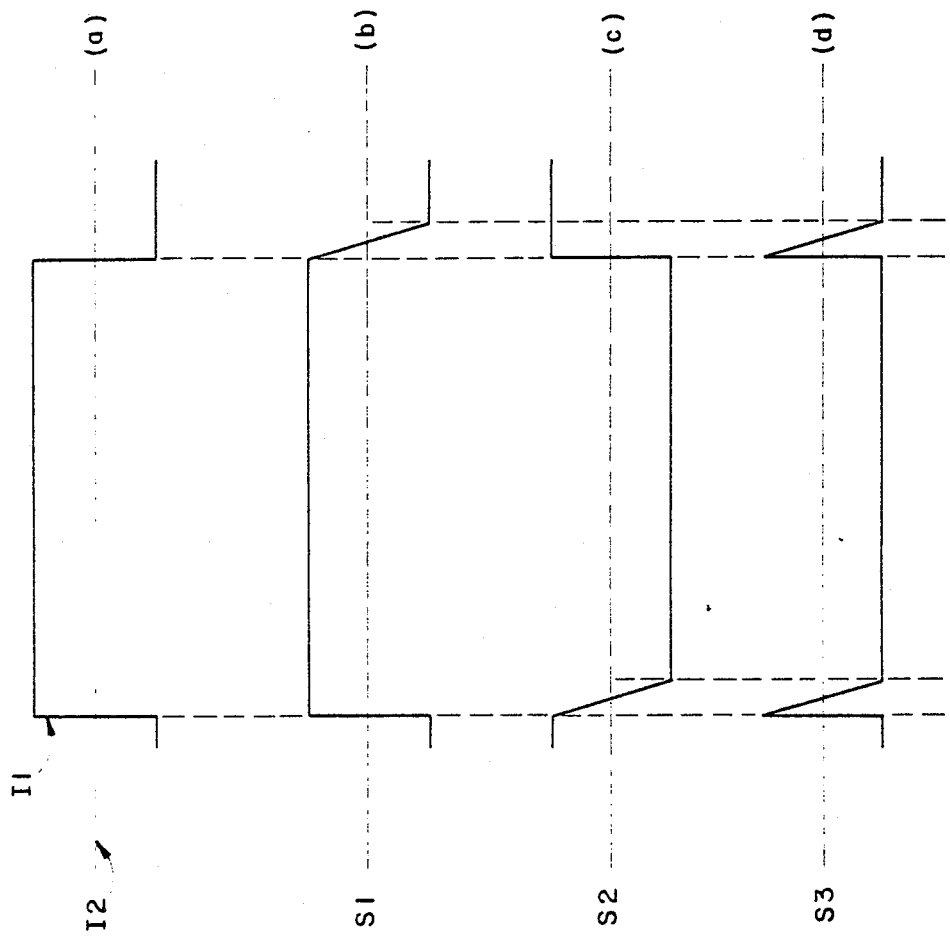

The video signal required to display the more nearly vertical portions of the displayed waveform is derived in a different manner than that described above for the more horizontal portions of the waveform. FIG. 11a shows an input signal at I1 with a nearly vertical rising and falling edge (solid line). The dashed line shows the voltage level at input I2 for a particular display scan line. FIG. 11b shows the waveform which appears at point S1'. Note that the rising edge of the waveform is essentially vertical, while the falling edge has a more gradual transition because of the gradual discharge of capacitor C1 through current source i1. Similarly, FIG. 11c shows the waveform appearing at point S2'. This signal is inverted from that at point S1', but once again has a more gradual falling edge than rising edge due to the effect of capacitor C2 and current source i2. FIG. 11d shows the waveform produced at point S3' by the combination of the signals at S1' and S2'. Note that a momentary voltage spike is produced on both the rising and falling edges of the input waveform. This is just the video signal required to represent the nearly vertical edges on the raster-type display. The values of capacitors C1 and C2 must be chosen to produce a video display in which the more nearly horizontal and more nearly vertical edges of the displayed waveform appear well-balanced in intensity and apparent "trace width". It should be noted that for portions of the displayed waveform which form transitions between more nearly horizontal and more nearly vertical regions, the two modes of operation just described will be blended to produce a smooth transition on the display.

It will be appreciated that the invention is not restricted to the specific waveform generators which have been described and shown, since variations may be made therein without departing from the scope of the invention as defined in the appended claims, and equivalents thereof.

I claim:

1. An apparatus for generating, from a voltage waveform which repeats at a predetermined rate, a video signal suitable to cause a representation of said waveform to be displayed on a raster scan display device having a display surface, means for producing a visible spot at the display surface, means for causing said spot to scan over said display surface in a rectangular raster scan pattern made up of a plurality of substantially rectilinear scan lines extending substantially parallel to one another in a predetermined direction, and means for varying the intensity of the spot, said apparatus comprising:

first means for forming an output signal representing the instantaneous difference between the voltage of the waveform and a voltage representing the position, in the raster scan pattern, of the scan line then being executed;

second means for receiving an input signal and producing, as an output signal, a clipped version thereof;

third means for receiving an input signal having voltage levels which are positive and negative with respect to a predetermined reference level and generating an output signal representing the absolute value thereof with respect to said reference level;

fourth means for receiving an input signal and producing, as an output signal, the inverse thereof;

fifth means for receiving an input signal including excursions from a given voltage level and producing an output signal in which the given voltage level is shiftable to a predetermined voltage level; and sixth means for receiving an input signal including excursions of a given amplitude and producing an output signal in which the excursions are adjustable to a predetermined amplitude;

said second, third, fourth, fifth and sixth means being connected together so that the input signal received by one such means is the output signal provided by another such means, and being connected to the first means so that the output signal of the first means is the input signal of one of the second to sixth means.

2. An apparatus according to claim 1, wherein the first and second means are constituted by a differential input amplifier.

3. An apparatus according to claim 1, having an output terminal at which the video signal is provided, and further comprising a sync mixer connected to the output terminal and to sources of sync and blanking signals for producing a composite video signal including both the output signal provided at said output terminal and sync and blanking signals.

4. An apparatus according to claim 1, wherein the third and fourth means are combined in a first circuit which receives an input signal having voltage levels which are positive and negative with respect to a predetermined reference level and produces, as an output signal, a signal representing the inverse of the absolute value of the input signal.

5. An apparatus according to claim 4, wherein said second, fifth and sixth means are combined in a second circuit which receives, as an input signal, the output signal of the first circuit and provides, as an output signal, said video signal, and wherein said first circuit is connected to receive, as its input signal, the output signal provided by said first means.

6. An apparatus according to claim 5, wherein the output signal of said first means is a differential output signal carried on two conductors, and said first circuit comprises a pair of diodes which are connected together and are connected to the two conductors respectively.

7. An apparatus according to claim 1, wherein the first and second means are combined in a first circuit which provides as an output signal, for small values of said difference, a signal representing the value of said difference and, for larger values of said difference, a signal representing a clipped version of the value of said difference.

8. An apparatus according to claim 7, wherein the output signal of the first circuit is a differential output signal carried on two conductors, and said apparatus further comprises first and second delay lines each having first and second opposite ends, the first ends of the two delay lines being connected to said two conductors respectively, and wherein said third and fourth means comprise a second circuit having a first pair of input terminals connected respectively to the first end of the first delay line and the second end of the second delay line, and a second pair of input terminals connected respectively to the first end of the second delay line and the second end of the first delay line.

9. An apparatus according to claim 8, wherein said second circuit includes first and second pairs of interconnected diodes connected to the first and second pairs of input terminals, and first and second transistors having their emitters connected together and having their bases connected to the first and second pairs of diodes respectively, whereby the voltage at the base of the first transistor corresponds to the lower of the two voltages at the first pair of input terminals, the voltage at the base of the second transistor corresponds to the lower of the two voltages at the second pair of input terminals, and the voltage at the emitters of the transistors corresponds to the higher of the two voltages at the bases of the transistors, so that for relatively slow changes in the differential voltage between the two conductors the voltages at the bases of the transistors are substantially equal to each other and to the voltage at the emitters of the transistors, whereas for a relatively fast change in the differential voltage the voltage at the emitters of the transistors forms a pulse of duration substantially equal to the delay produced by the delay lines.

10. An apparatus according to claim 7, wherein the output signal of the first circuit is a differential output signal carried on two conductors, and said apparatus further comprises first and second slew rate limiting devices connected to the two conductors respectively, and wherein the third and fourth means comprise a second circuit having first and second input terminals connected to the first and second slew rate limiting devices respectively.

11. An apparatus according to claim 10, wherein the slew rate limiting devices are capacitors which are connected to the two conductors by way of respective transistors connected as emitter followers and provided with respective emitter load current sources, whereby the capacitors can be charged more rapidly by the emitter followers than they can be discharged by the current sources.

12. An apparatus according to claim 11, wherein the second circuit comprises first and second emitter followers connected to the first and second slew rate limiting devices respectively and having their emitters connected to a pair of interconnected diodes.

* * * * *